United States Patent
Bitting et al.

(10) Patent No.: US 7,802,156 B2
(45) Date of Patent: Sep. 21, 2010

(54) IDENTIFICATION CIRCUIT WITH REPEATABLE OUTPUT CODE

(75) Inventors: Ricky F. Bitting, Fort Collins, CO (US); Donald T. McGrath, Fort Collins, CO (US); Danny C. Vogel, Sudbury, MA (US)

(73) Assignee: LSI Corporation, Milpitas, CA (US)

( * ) Notice: Subject to any disclaimer, the term of this patent is extended or adjusted under 35 U.S.C. 154(b) by 1063 days.

(21) Appl. No.: 11/466,876

(22) Filed: Aug. 24, 2006

(65) Prior Publication Data

US 2009/0323870 A1   Dec. 31, 2009

Related U.S. Application Data

(60) Provisional application No. 60/810,207, filed on May 31, 2006.

(51) Int. Cl.
*G01R 31/28* (2006.01)
*G11C 29/00* (2006.01)

(52) U.S. Cl. .................. 714/724; 714/764

(58) Field of Classification Search ............ 714/718, 714/724, 764
See application file for complete search history.

(56) References Cited

U.S. PATENT DOCUMENTS

| | | | | |
|---|---|---|---|---|
| 5,023,839 A * | 6/1991 | Suzuki et al. | .......... | 365/185.21 |
| 6,161,213 A | 12/2000 | Lofstrom | | |
| 6,738,788 B1 | 5/2004 | Horng et al. | | |
| 6,802,447 B2 | 10/2004 | Horng | | |
| 6,839,875 B2 * | 1/2005 | Roohparvar | ................ | 714/773 |
| 7,100,097 B2 * | 8/2006 | Patella et al. | ................ | 714/718 |
| 7,605,700 B2 * | 10/2009 | Drago et al. | ............. | 340/572.1 |
| 2005/0183047 A1 | 8/2005 | Sapiro | | |
| 2008/0244360 A1 * | 10/2008 | Mokhlesi et al. | ............ | 714/758 |

OTHER PUBLICATIONS www.siidtech.com, web site for SiidTech Inc., captured on Aug. 24, 2006.

* cited by examiner

*Primary Examiner*—James C Kerveros
(74) *Attorney, Agent, or Firm*—Luedeka, Neely & Graham, P.C.

(57) ABSTRACT

A comparator receives first differentials, compares the differentials to a positive offset, and sets bits dependent upon whether the differentials are greater than the positive offset. The comparator receives second differentials, compares the differentials to a negative offset, and sets bits dependent upon whether the differentials are greater than the negative offset. The comparator compares the first bits to the second bits, and sets a mask dependent upon whether the first bits and the second bits are identical. The comparator receives subsequent differentials, compares the differentials to a zero offset, and sets bits dependent upon whether the differentials are greater than the zero offset. The subsequent bits are compared to the mask and corrected.

10 Claims, 2 Drawing Sheets

IDENTIFICATION CIRCUIT WITH REPEATABLE OUTPUT CODE

This application claims priority on provisional application 60/810,207, filed 2006.05.31.

FIELD

This invention relates to the field of integrated circuit fabrication. More particularly, this invention relates to correcting soft bits in a bit stream, such as can be used to uniquely identify integrated circuits or provide an encryption key.

BACKGROUND

Integrated circuits have evolved into enormously complex devices, which are fabricated by equally complex processes. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Integrated circuits are typically processed in a wafer form on a common semiconducting substrate, which substrate typically holds something in the neighborhood of a few hundred individual integrated circuits, depending on die size and wafer size. A variety of information on the processing of the substrate is typically recorded in a database. Thus, while the integrated circuits are in wafer form, it is relatively easy to look back upon the recorded processing history for the integrated circuits, by first identifying the substrate upon which the integrated circuits reside, and then accessing the information for the substrate. Such information can be very useful in determining the causes of problems that might be noticed at a later point in the fabrication cycle.

However, once the individual integrated circuits are singulated and packaged, it might be impossible to determine the substrate from which a given integrated circuit was taken, and the processing that the substrate received. However, for a variety of different reasons, such information could be extremely useful. For example, determining the processing given an integrated circuit that failed in the field could help prevent additional future failures for the same cause.

What is needed, therefore, is a system that overcomes problems such as those described above, at least in part.

SUMMARY

The above and other needs are met by a comparator that receives a first read of voltage differentials from a series of bit cells, compares the first read to a positive voltage offset of a given magnitude, and set bits in a first bit stream to values that are dependent upon whether the voltage differential from a given bit cell is greater than the positive voltage offset. The first bit stream is then stored in a first register. The comparator also receives a second read of the voltage differentials from the series of bit cells, compares the second read to a negative voltage offset of the given magnitude, and sets bits in a second bit stream to values that are dependent upon whether the voltage differential from a given bit cell is greater than the positive voltage offset. The second bit stream is stored in a second register.

The comparator then compares the first bit stream to the second bit stream, and set bits in a mask string dependent upon whether the bits in a given position of the first bit stream and the second bit stream are identical. A third register receives the mask string. The comparator additionally receives a subsequent read of the voltage differentials from the series of bit cells, compares the subsequent read to a zero voltage offset, and set bits in a subsequent bit stream to values that are dependent upon whether the voltage differential from a given bit cell is greater than the zero voltage offset. The subsequent bit stream is compared to the mask string, and bits of the subsequent bit stream that are disposed in positions set in the mask string are corrected.

In various embodiments, the bits of the bit stream disposed in positions set in the mask string are corrected by removing the bits disposed in the positions and compacting remaining bits in the bit stream. Alternately, the bits of the bit stream disposed in positions set in the mask string are corrected by setting the bits disposed in the positions to a given value.

According to another aspect of the present invention there is described a method for stabilizing soft bits in a bit stream, by receiving a first read of voltage differentials from a series of bit cells and comparing the first read to a positive voltage offset of a given magnitude. Bits in a first bit stream are set to values that are dependent upon whether the voltage differential from a given bit cell is greater than the positive voltage offset, and the first bit stream is stored in a first register. A second read of voltage differentials is received from the series of bit cells, and compared to a negative voltage offset of the given magnitude. Bits in a second bit stream are set to values that are dependent upon whether the voltage differential from a given bit cell is greater than the positive voltage offset, and the second bit stream is stored in a second register.

The first bit stream is compared to the second bit stream, and bits in a mask string are set dependent upon whether the bits in a given position of the first read of the bit stream and the second read of the bit stream are identical. A subsequent read of the voltage differentials from the series of bit cells is received and compared to a zero voltage offset. Bits in a subsequent bit stream are set to values that are dependent upon whether the voltage differential from a given bit cell is greater than the zero voltage offset. The subsequent bit stream is compared to the mask string, and bits of the subsequent bit stream disposed in positions set in the mask string are corrected.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

With reference now to the figures, there is depicted a method and apparatus for providing a unique chip identification circuit 10 for an integrated circuit, which chip identification does not require specialized processing to create the unique identification for the integrated circuit, and which is stable and can be reliably read across repeated instances and a duration of time. In addition, the circuitry as described herein may also be used to produce a stable encryption key, and for other high security applications.

In basic concept, there is provided a random identification circuit 28 and supporting circuitry in a design 10 that is added to each individual integrated circuit as a part of the mask set for the integrated circuits. Thus, as the integrated circuits are fabricated in wafer form, the circuit 10 is fabricated at the same time. Thus, no additional processing is required to fabricate the circuit 10.

Figure 1:
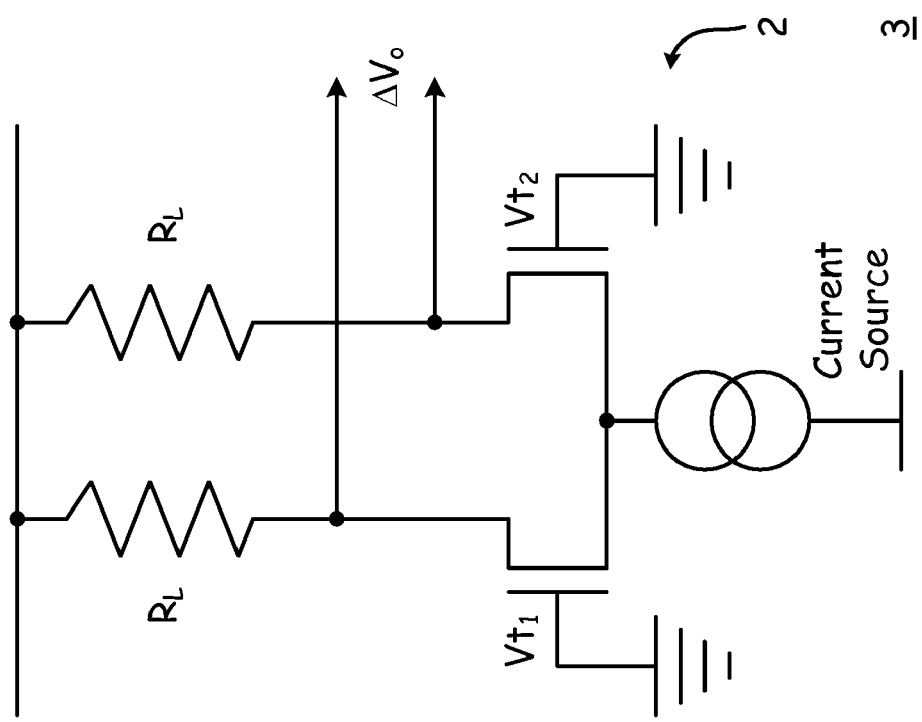
FIG. 1 is a circuit diagram of one embodiment of a die trace bit cell for use in a chip identification or encryption key circuit.

The circuit 10 preferably has at least one property such the circuits 10 on different chips will produce at least one characteristic that is different from chip to chip, even though the circuit 10 on each of the different chips receives the same input. FIG. 1 depicts one example of a die trace bit cell 2 on an integrated circuit 3, from which the random identification circuit 28 for a circuit 10 can be constructed. It is appreciated that other circuits may also be used for the random identification circuit 28. The cell 2 comprises two transistors having a voltage threshold $Vt_1$ and $Vt_2$. The two transistors are preferably connected to a common current source, ground, and current drain through two resistors $R_L$.

Because of the similarities in the fabrication and design of the two transistors, it might be expected that they would have exactly the same voltage threshold. However, very subtle differences in the transistors typically arise such as by "chance" or other uncharacterized processing and material differences. Thus, there tends to be a measurable difference $\Delta V_0$ between the voltage thresholds $Vt_1$ and $Vt_2$. Depending upon which of the two voltage thresholds is greater than the other, this voltage difference can be interpreted as either a logical zero or a logical one from the bit cell 2. Practically speaking, the value of the bit cell 2, either zero or one, tends to be completely random from one integrated circuit to another.

Figure 2:
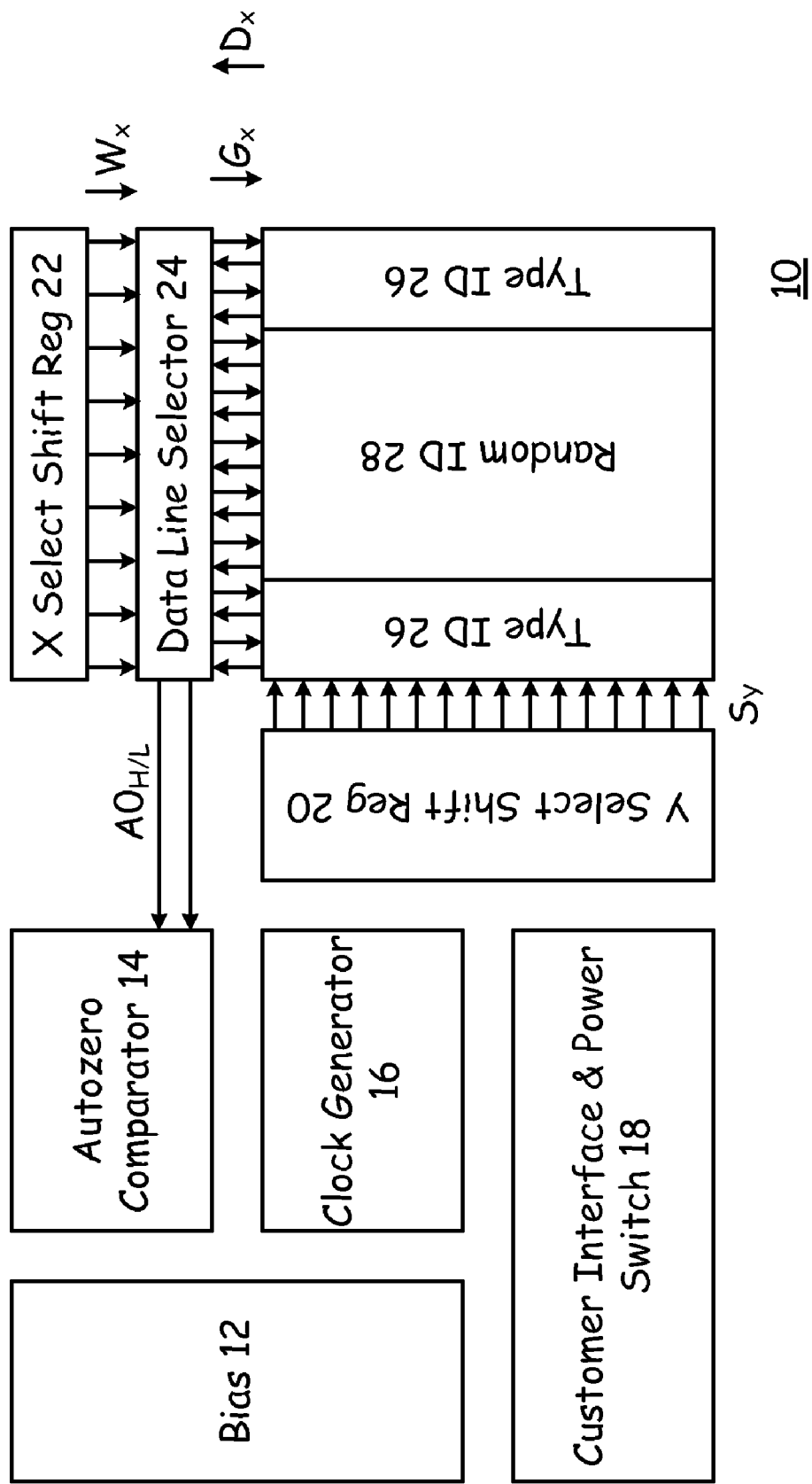
FIG. 2 is a test circuit for identifying unstable bits in a bit stream produced by a random identification circuit.

Thus, by stringing together a given number of the bit cells 2—such as 128, 256, or some other number—a random identification circuit 28, as depicted in FIG. 2, can be formed that has a desired number of random values. For example, 128 of the bit cells 2 could be formed into the random identification circuit 28, and the circuit 10 would have a random 128 bit value. By forming a circuit 10 with a great enough number of bit cells 2 (where "great enough" is determined by the number of integrated circuits that are to be identified), each integrated circuit having the chip identification circuit 10 can be uniquely identified by reading the chip identification circuit 10. Further, a value of sufficient complexity can be formed for use as an encryption key, or for other security applications.

Unfortunately, some of the bit cells 2 have transistors with voltage thresholds $Vt_1$ and $Vt_2$ that are so close in value one to another, that the voltage differential $\Delta V_0$ is either so small that it cannot be reliably read, or actually flips back and forth in value from negative to positive (for example). Thus, such a bit cell 2, referred to as a soft cell that produces a soft bit, would tend to change its value in an unpredictable manner as it is read from time to time, thereby changing the value of the seed generator 12. This tends to make the random identification circuit 28 unreliable as a means for uniquely and repeatedly identifying the integrated circuit or producing an encryption key. Therefore, it is desirable to identify such soft cells 2, and either remove them in some manner from the random identification circuit 28 or fix them to some stable value. This is accomplished by the rest of the circuitry in the circuit 10.

The circuit block 26/28 produces a serial bit stream that is shifted out of the block through the data line selector 24 according to the addressing of the Y select register 20 and X select register 22. Power is supplied by bias 12, and the bit stream is produced according to clock 16. A customer interface and power switch 18 are provided as a control means to the circuit 10.

The internal analog array supply of the cell 28 is preferably grounded and power is turned off when the cell 28 is not selected. Since the cell 28 is selected only for a few milliseconds, and the array devices therein are only weakly turned on, there should be no hot-carrier damage or other drift.

The bits in the serial bit stream are random from circuit 10 to circuit 10, but are repeatable within a given circuit 10. In other words, they are different on every integrated circuit, but substantially the same for every read of a given circuit 10. Portions of the circuit 10 as described below are used correct that part of the cell 28 that might not be the same from read to read. Some number of bits in block 26 are preferably fixed as TypeID ROM bits and are the same for every integrated circuit of a given type.

The inputs to the cell 28 are control signals plus two clock signals, and the output is a serial bit stream. The two clock signals can be ORed together, so that a single vector can produce two clock pulses.

Soft bits in the bit stream produced by the cell 28 are preferably identified and corrected by adding an offset voltage to the comparator 14. The magnitude of the added offset is preferably greater then the anticipated drift within a given cell 2. However, the offset is preferably also not too large, or too many bits will be eliminated from the bit stream as soft bits. Another complication is that for any offset value that is chosen, a bit cell 2 may have a voltage difference $\Delta V_0$ exactly equal to this offset value. This condition results in the affected bit being identified as soft on one calibration run, but valid on a subsequent run. However, if the offset threshold chosen is large enough, the valid bits will not change sign.

To determine a mask for removing soft bits, a calibration routine is preferably run only once during final test. The calibration algorithm starts by setting the comparator 14 trip-point to +Vn, the positive value of the offset voltage. The cells 2 are read for $\Delta V_0$, which is compared in the comparator 14 to the trip point of +Vn, and the resultant logical 1 or logical 0 for each cell 2 is saved, where, for example, cells 2 having a voltage differential that is greater than the trip point are logged as 1's and cells 2 having a voltage differential that is less than the trip point are logged as 0's. The comparator 14 trip-point is then set to −Vn, the negative value of the offset voltage, and the cells 2 are read again, and the results of the second reading are again saved, for example, in the manner as described above. The results from the two readings are compared to each other, and any bit positions that are different are logged. These are the locations of the so-called soft bits that do not have a voltage differential that is greater than the offset voltage that was selected. The positions of the soft bits are preferably stored in a non-volatile memory. This is the soft bit mask that is preferably used for all subsequent reads, during which the offset voltage is set to zero. This mask has no correlation to the random code, but simply records the position of the soft bits to be masked out.

The corrected identification code is read by setting the comparator 14 trip-point to zero, reading the serial bit stream, and saving the results. Bits from the bit stream that are in positions recorded in the soft bit mask are either discarded or set to a given value. If the soft bits are discarded, then the serial bit stream is compacted and output as the corrected code. If the soft bits are set to s specific value, then entire stream is output as the corrected code.

The zero-crossing and skewed offset detection functions can alternately be done in parallel by using three comparators 14 (one with zero offset, one with +Vn, and one with −Vn). This approach allows the calibration to be performed faster.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A circuit for stabilizing soft bits in a bit stream, the circuit comprising:
    a comparator adapted to receive a first read of voltage differentials from a series of bit cells and compare the first read to a positive voltage offset of a given magnitude, and set bits in a first bit stream to values that are dependent upon whether the voltage differential from the first read of a given bit cell is greater than the positive voltage offset, and store the first bit stream in a first register,
    the comparator also adapted to receive a second read of the voltage differentials from the series of bit cells and compare the second read to a negative voltage offset of the given magnitude, and set bits in a second bit stream to values that are dependent upon whether the voltage differential from the second read of a given bit cell is less than the negative voltage offset, and store the second bit stream in a second register,
    the comparator further adapted to compare the first bit stream to the second bit stream, and set bits in a mask string dependent upon whether the bits in a given position of the first bit stream and the second bit stream are identical,
    a third register adapted to receive the mask string, and
    the comparator additionally adapted to receive a subsequent read of the voltage differentials from the series of bit cells and compare the subsequent read to a zero voltage offset, and set bits in a subsequent bit stream to values that are dependent upon whether the voltage differential from the subsequent read of a given bit cell is greater than the zero voltage offset, compare the subsequent bit stream to the mask string, and correct bits of the subsequent bit stream disposed in positions set in the mask string.

2. The circuit of claim 1, wherein the bits of the bit stream disposed in positions set in the mask string are corrected by removing the bits disposed in the positions and compacting remaining bits in the bit stream.

3. The circuit of claim 1, wherein the bits of the bit stream disposed in positions set in the mask string are corrected by setting the bits disposed in the positions to a given value.

4. An integrated circuit having a circuit for stabilizing soft bits in a bit stream, the circuit comprising:
    a comparator adapted to receive a first read of voltage differentials from a series of bit cells and compare the first read to a positive voltage offset of a given magnitude, and set bits in a first bit stream to values that are dependent upon whether the voltage differential from the first read of a given bit cell is greater than the positive voltage offset, and store the first bit stream in a first register,
    the comparator also adapted to receive a second read of the voltage differentials from the series of bit cells and compare the second read to a negative voltage offset of the given magnitude, and set bits in a second bit stream to values that are dependent upon whether the voltage differential from the second read of a given bit cell is less than the negative voltage offset, and store the second bit stream in a second register,
    the comparator further adapted to compare the first bit stream to the second bit stream, and set bits in a mask string dependent upon whether the bits in a given position of the first bit stream and the second bit stream are identical,
    a third register adapted to receive the mask string, and
    the comparator additionally adapted to receive a subsequent read of the voltage differentials from the series of bit cells and compare the subsequent read to a zero voltage offset, and set bits in a subsequent bit stream to values that are dependent upon whether the voltage differential from the subsequent read of a given bit cell is greater than the zero voltage offset, compare the subsequent bit stream to the mask string, and correct bits of the subsequent bit stream disposed in positions set in the mask string.

5. The integrated circuit of claim 4, wherein the bits of the bit stream disposed in positions set in the mask string are corrected by removing the bits disposed in the positions and compacting remaining bits in the bit stream.

6. The integrated circuit of claim 4, wherein the bits of the bit stream disposed in positions set in the mask string are corrected by setting the bits disposed in the positions to a given value.

7. A method for stabilizing soft bits in a bit stream, the method comprising the steps of:
    receiving a first read of voltage differentials from a series of bit cells,
    comparing the first read to a positive voltage offset of a given magnitude,
    setting bits in a first bit stream to values that are dependent upon whether the voltage differential from the first read of a given bit cell is greater than the positive voltage offset,
    storing the first bit stream in a first register,
    receiving a second read of voltage differentials from the series of bit cells,
    comparing the second read to a negative voltage offset of the given magnitude,
    setting bits in a second bit stream to values that are dependent upon whether the voltage differential from the second read of a given bit cell is less than the negative voltage offset,
    storing the second bit stream in a second register,
    comparing the first bit stream to the second bit stream,
    setting bits in a mask string dependent upon whether the bits in a given position of the first read of the bit stream and the second read of the bit stream are identical,
    receiving a subsequent read of the voltage differentials from the series of bit cells,
    comparing the subsequent read to a zero voltage offset,
    setting bits in a subsequent bit stream to values that are dependent upon whether the voltage differential from the subsequent read of a given bit cell is greater than the zero voltage offset, comparing the subsequent bit stream to the mask string, and correcting bits of the subsequent bit stream disposed in positions set in the mask string.

8. The method of claim 7, wherein the step of correcting the bits of the subsequent bit stream disposed in positions set in the mask string is accomplished by removing the bits disposed in the positions and compacting remaining bits in the bit stream.

9. The method of claim 7, wherein the step of correcting the bits of the subsequent bit stream disposed in positions set in the mask string is accomplished by setting the bits disposed in the positions to a given value.

10. The method of claim 7, further comprising the step of using the corrected subsequent bit stream as an identification string.

* * * * *